(12) United States Patent
Hoffart et al.

(10) Patent No.: US 8,221,652 B2
(45) Date of Patent: Jul. 17, 2012

(54) PROCESS OF PREPARING REGIOREGULAR POLYMERS

(75) Inventors: Timo Hoffart, Darmstadt (DE); Birgit Falk, Riedstadt (DE); Iain McCulloch, Southampton (GB); Weimin Zhang, Southampton (GB); Martin Heeney, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 462 days.

(21) Appl. No.: 12/524,611

(22) PCT Filed: Dec. 10, 2007

(86) PCT No.: PCT/EP2007/010744
§ 371 (c)(1),
(2), (4) Date: Jul. 27, 2009

(87) PCT Pub. No.: WO2008/092490
PCT Pub. Date: Aug. 7, 2008

(65) Prior Publication Data
US 2010/0084614 A1    Apr. 8, 2010

(30) Foreign Application Priority Data
Jan. 31, 2007  (EP) ..................................... 07002093

(51) Int. Cl.
*H01B 1/00* (2006.01)
*C08G 75/00* (2006.01)
*C08G 59/00* (2006.01)

(52) U.S. Cl. ......................... 252/500; 528/377; 528/403
(58) Field of Classification Search .................. 252/500; 528/377, 403
See application file for complete search history.

(56) References Cited

U.S. PATENT DOCUMENTS

| | | | |
|---|---|---|---|
| 5,540,999 A | 7/1996 | Yamamoto et al. | |
| 6,197,922 B1 | 3/2001 | Mohwald et al. | |
| 2004/0254336 A1 | 12/2004 | Xiao et al. | |
| 2006/0006379 A1 | 1/2006 | Lee et al. | |
| 2006/0155105 A1 | 7/2006 | Werner et al. | |
| 2006/0255334 A1 | 11/2006 | Lee et al. | |
| 2006/0278867 A1 | 12/2006 | McCullough et al. | |

FOREIGN PATENT DOCUMENTS

| EP | 0 643 118 A1 | 3/1995 |
|---|---|---|
| EP | 1 615 237 A1 | 1/2006 |
| WO | WO 2007/059838 A1 | 5/2007 |
| WO | WO 2007/059849 A1 | 5/2007 |

OTHER PUBLICATIONS

International Search Report of PCT/EP2007/010744 (May 12, 2008).
T. Yamamoto et al., "Preparation of—Conjugated Poly(thiophene-2,5-diyl), Poly(p-phenylene), and Related Polymers Using Zerovalent Nickel Complexes. Linear Structure and Properties of the—Conjugated Polymers", Macromolecules, vol. 25, No. 4 (Feb. 17, 1992) pp. 1214-1223.
H. Mao et al. "Synthesis and Structure-Property Relationships of Regioirregular Poly(3-hexylthiophenes)", Macromolecules, vol. 26, No. 26 (Mar. 1, 1993) pp. 1163-1169.
R.C. Hiorns et al., "High Molecular Weights, Polydispersities, and Annealing Temperatures in the Optimization of Bulk-Heterojunction Photovoltaic Cells Based on Poly(3-hexylthiophene) or Poly(3-butylthiophene)", Adv. Funct. Mater., vol. 16 (2006) pp. 2263-2273.

*Primary Examiner* — Mark Kopec
*Assistant Examiner* — Jaison Thomas
(74) *Attorney, Agent, or Firm* — Millen, White, Zelano & Branigan, P.C.

(57) ABSTRACT

The invention relates to a process of preparing regioregular polymers, in particular head-to-tail (HT) poly-(3-substituted) thiophenes or selenophenes with high regioregularity and defined molecular weight, to novel polymers prepared by this process, to the use of the novel polymers as semiconductors or charge transport materials in optical, electrooptical or electronic devices including field effect transistors (FETs), electroluminescent, photovoltaic and sensor devices, and to FETs and other semiconducting components or materials comprising the novel polymers.

14 Claims, No Drawings

PROCESS OF PREPARING REGIOREGULAR POLYMERS

FIELD OF INVENTION

The invention relates to a process of preparing regioregular polymers, in particular head-to-tail (HT) poly-(3-substituted) thiophenes or selenophenes with high regioregularity and defined molecular weight, and to novel polymers prepared by this process. The invention further relates to the use of the novel polymers as semiconductors or charge transport materials in optical, electrooptical or electronic devices including field effect transistors (FETs), electroluminescent, photovoltaic and sensor devices. The invention further relates to FETs and other semiconducting components or materials comprising the novel polymers.

BACKGROUND AND PRIOR ART

Organic materials have recently shown promise as the active layer in organic based thin film transistors and organic field effect transistors (OFETs) (see Katz, Bao and Gilat, *Acc. Chem. Res.*, 2001, 34, 5, 359). Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semiconducting material and the current on/off ratio, so the ideal semiconductor should have a low conductivity in the off state, combined with a high charge carrier mobility ($>1\times10^{-3}$ cm$^2$ V$^{-1}$ s$^{-1}$). In addition, it is important that the semiconducting material is relatively stable to oxidation i.e. it has a high ionisation potential, as oxidation leads to reduced device performance.

In prior art regioregular head-to-tail (HT) poly-(3-alkylthiophene) (P3AT), in particular poly-(3-hexylthiophene) (P3HT), has been suggested for use as semiconducting material, as it shows charge carrier mobility between $1\times10^{-5}$ and 0.1 cm$^2$ V$^{-1}$ s$^{-1}$. P3AT is a semi-conducting polymer that has shown good performance as the active hole transporting layer in field effect transistors (see Sirringhaus et al, *Nature*, 1999, 401, 685-688), and photovoltaic cells (see Coakley, McGehee et al., *Chem. Mater.*, 2004, 16, 4533). The charge carrier mobility, and hence the performance of these applications, have been shown to be strongly dependent on the regiorepositioning (or regioregularity) of the alkyl sidechains of the polymer backbone. A high regioregularity means a high degree of head-to-tail (HT) couplings and a low amount of head-to-head (HH) couplings or tail-to-tail (TT) couplings as shown below:

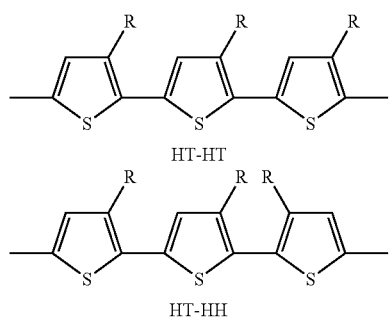

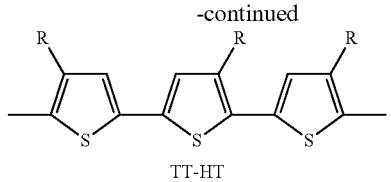

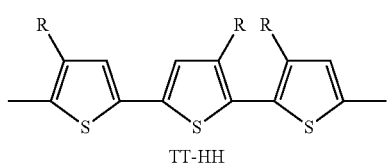

This leads to good packing of the polymers in the solid state and high charge carrier mobility.

Typically a regioregularity greater than 90% is necessary for good performance. In addition to high regioregularity, high molecular weights are desirable in order to enhance the processability and printability of formulations of P3AT. Higher molecular weights also result in increased glass transition temperatures for the polymer, whereas low glass transition temperatures can cause device failure during operation because of unwanted morphological changes occurring at raised temperatures.

Several methods to produce highly regioregular HT-P3AT have been reported in prior art, for example in the review of R. D. McCullough, *Adv. Mater.*, 1998, 10(2), 93-116 and the references cited therein.

For example, regioregular polymers have been prepared by the "Stille-method" (see Stille, Iraqi, Barker et al., *J. Mater. Chem.*, 1998, 8, 25) as illustrated below

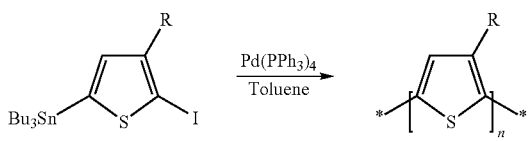

or by the "Suzuki-method" (see Suzuki, Guillerez, Bidan et al., *Synth. Met.*, 1998, 93, 123) as shown below.

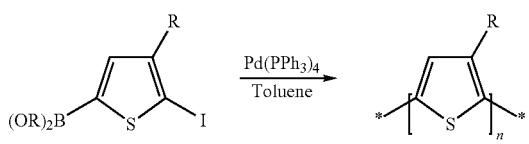

However, both of these methods have the drawback of requiring an additional process step to obtain and purify the organometallic intermediate.

Other known methods to prepare HT-P3AT with a regioregularity≧90%, starting from 2,5-dibromo-3-alkylthiophene, include for example the "Rieke method", wherein the educt (wherein R is alkyl) is reacted with highly reactive zinc in THF as illustrated below and disclosed e.g. in WO 93/15086 (A1).

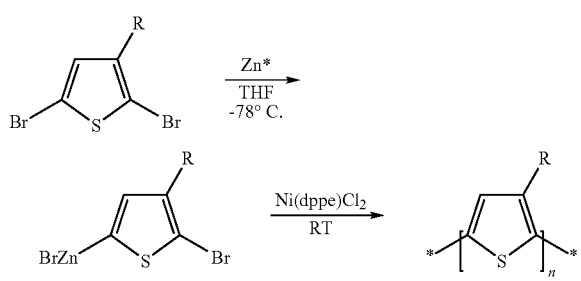

The resulting organozinc species is then reacted with a nickel (II) catalyst, Ni(dppe)Cl$_2$, to afford the polymer. Reaction with a nickel (0) catalyst, Ni(PPh$_3$)$_4$, was reported to afford a polymer of lower regioregularity (65%). Reaction with a palladium (0) catalyst (Pd(PPh$_3$)$_4$) was also reported to afford a polymer of low regioregularity (50%) (see Chen, *J. Am. Chem. Soc.*, 1992, 114, 10087).

Also known is the method to prepare regioregular HT-P3AT as described in McCullough et al., *Adv. Mater.*, 1999, 11(3), 250-253 and in EP 1 028 136 A1 and U.S. Pat. No. 6,166,172. According to this route the educt is reacted with methylmagnesium bromide in THF as shown below.

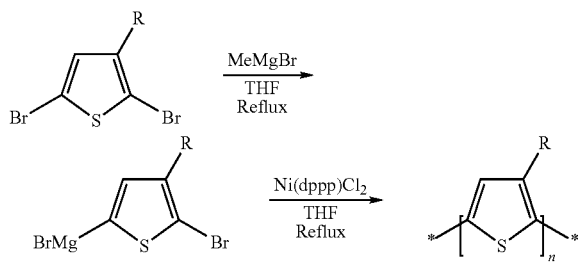

The resulting organomagnesium reagent is reacted with a nickel (II) catalyst to afford the regioregular polymer. In McCullough et al., *Macromolecules*, 2005, 38, 8649, this reaction is further investigated. This reference reports that the nickel (II) acts as an initiator in a "living" type polymerization, that the molecular weight of the polymer is related to the concentration of nickel (II) catalyst, and that number average molecular weights (M$_n$) in the region of 10,000 with polydispersities around 1.5 are obtained.

Both the Rieke and McCullough methods specify the use of a nickel (II) catalyst in order to obtain polymer of high regioregularity. Molecular weights (M$_n$) in the region of 20-35,000 were reported.

Yamamoto, T. *Macromolecules*, 1992, 25, 1214 reports the polymerisation of 2,5-dibromo-3-alkylthiophene by adding a stoichiometric amount of bis(1,5-cyclooctadiene)nickel in the presence of a monodentate phosphine ligand as shown below.

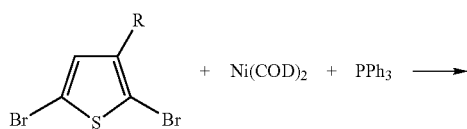

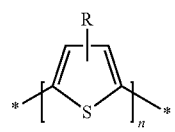

However, this method only afforded polymer of low regioregularity (65%) and intermediate molecular weight (M$_n$=15,000). Besides, the use of stoichiometric amounts of Ni(COD)$_2$ is highly undesirable due to the toxicity of this reagent.

WO 2005/014691 A1 discloses a process for preparing regioregular HT-P3AT by reacting a 2,5-dihalo-3-alkylthiophene with pure magnesium to form a regiochemical Grignard intermediate, and polymerising said intermediate by adding a catalyst, for example a Ni(II) catalyst.

For some applications, especially in FETs, P3ATs with molecular weights higher than those reported in prior art are desirable. High molecular weight polymers offer several advantages: As the molecular weight of a polymer increases, most properties scale with molecular weight until a plateau is reached, at which there is typically little further dependence. It is desirable to achieve molecular weights well above this plateau region in order to minimise a variation in performance with molecular weight, and hence minimise batch to batch discrepancies. Due to physical entanglements that occur in polymers of molecular weight above the plateau region, the mechanical properties improve. In addition, printing formulations of high molecular weight polymers can achieve high enough viscosity to be applied in a range of graphical arts printing processes including offset and gravure, whereas the typical viscosity achieved by regular P3HT of less than 10 centipoise would not suffice for such processes.

The non-prepublished international patent application WO2006/010267 discloses a process of preparing regioregular HT-P3AT or HT-poly(3-alkyselenophene) (P3AS) by reacting a 2,5-dihalo-3-alkylthiophene or -selenophene with an appropriate Grignard or zinc reagent, and bringing the resulting organomagnesium or organozinc intermediate in contact with a catalytic amount of a nickel (0) catalyst and a bidentate ligand to start a polymerisation reaction. It reports that the use of a Ni(0) catalyst instead of a Ni(II) catalyst results in a highly reactive catalyst system, and yields polymers of very high molecular weights and high regioregularity.

On the other hand, if the molecular weight of the polymer is too high, its solubility in organic solvents and thereby its processibility in the formation of semiconductor devices can deteriorate. Therefore, the process of preparing the polymer should also allow to control its molecular weight.

Thus, there is still a need for an improved method of preparing polymers, in particular P3AT and P3AS, with high regioregularity, predictable and defined molecular weight, good processibility, high purity and high yields in an economical, effective and environmentally beneficial way, which is especially suitable for industrial large scale production.

It was an aim of the present invention to provide an improved process for preparing polymers having these advantages, but not having the drawbacks of prior art methods mentioned above. Other aims of the present invention are immediately evident to the person skilled in the art from the following detailed description.

The inventors of the present invention have found that these aims can be achieved by a process as described below. In particular, it was surprisingly found that it is possible to prepare P3AT or P3AS with high regioregularity and predictable molecular weight by a process similar to that disclosed in WO2006/010267, but wherein the catalyst activation reaction and the polymerisation reaction are separated. This can be achieved by first activating the Ni(0) complex by addition of a small amount of a halothiophene or haloselenophene derivative, and then bringing the activated complex in contact with the organomagnesium or organozinc intermediate that has been created separately as described above. This process allows a reproducible activation of the Ni(0) complex prior to the polymerisation reaction, and enables a better control over the molecular weight of the polymer thereby obtained.

SUMMARY OF THE INVENTION

The invention relates to a process for preparing a regioregular poly(3-substituted thiophene) or poly(3-substituted selenophene) by
a) reacting a 3-substituted thiophene or 3-substituted selenophene each having leaving groups in 2- and 5-position ("educt") with magnesium or reactive zinc or an organomagnesium halide,
b) reacting a Ni(0) catalyst and a bidentate ligand with an aromatic monomer or oligomer having one or more leaving groups ("activator"),
c) bringing the reaction mixtures resulting from step a) and b) into contact with each other, and optionally agitating and/or heating the resulting mixture, thereby starting a polymerisation reaction,
d) optionally adding a reagent that stops the polymerisation reaction, and optionally recovering the polymer from the reaction mixture.

The invention further relates to a process for preparing a regioregular polymer of formula I

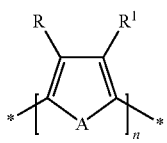

I wherein A is S or Se, R is H or F, n is an integer>1, and $R^1$ is a carbyl or hydrocarbyl group that optionally comprises one or more hetero atoms and does not react under the conditions described for the process of the present invention, by
a) reacting a compound of formula II ("educt")

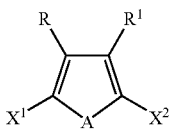

II wherein A, R and $R^1$ are as defined in formula I, and $X^1$ and $X^2$ are independently of each other a leaving group,
with magnesium or reactive zinc or an organomagnesium halide, whereby an organomagnesium or organozinc intermediate or a mixture of organomagnesium or organozinc intermediates is generated,
b) reacting a Ni(0) catalyst and a bidentate ligand with an aromatic monomer or oligomer having one or more leaving groups ("activator"),
c) bringing the intermediate or intermediate mixture obtained by step a) into contact with the mixture obtained by step b), and optionally agitating and/or heating the resulting mixture, thereby starting a polymerisation reaction,
d) optionally adding a reagent that stops the polymerisation reaction, and optionally recovering the resulting polymer from the mixture.

The invention further relates to a process for preparing a regioregular polymer as described above and below, by
a1) reacting the educt with an organomagnesium halide in an organic solvent, whereby an organomagnesium intermediate is generated, or alternatively
a2) reacting the educt with magnesium metal in an organic solvent, whereby an organomagnesium intermediate is generated, or alternatively
a3) reacting the educt with reactive zinc in an organic solvent, whereby an organozinc intermediate is generated, or alternatively
a4) generating an organomagnesium intermediate as described in step a1) or a2), and reacting said intermediate with a zinc dihalide, whereby an organozinc intermediate is generated,
and
b) reacting a catalytic amount of a Ni(0) catalyst and a bidentate ligand with the activator,
and
c) bringing the intermediate or intermediate mixture obtained by one of steps a1)-a4) into contact with the mixture obtained by step b), and optionally agitating and/or heating the resulting mixture, thereby starting a polymerisation reaction,
and
d) optionally adding a reagent that stops the polymerisation reaction, and optionally recovering the resulting polymer from the mixture.

The invention further relates to novel polymers, in particular novel poly-3-substituted thiophenes or selenophenes, obtainable or obtained by a process as described above and below, especially having a predictable molecular weight and a high regioregularity.

The invention further relates to a semiconductor or charge transport material, component or device comprising one or more polymers as described above and below.

The invention further relates to the use of polymers according to the present invention as charge-transport, semiconducting, electrically conducting, photoconducting or light-emitting material in optical, electrooptical or electronic components or devices, organic field effect transistors (OFET), integrated circuitry (IC), thin film transistors (TFT), flat panel displays, radio frequency identification (RFID) tags, electroluminescent or photoluminescent devices or components, organic light emitting diodes (OLED), backlights of displays, organic photovoltaic (OPV) or sensor devices, charge injection layers, Schottky diodes, planarising layers, antistatic films, conducting substrates or patterns, electrode materials in batteries, photoconductors, electrophotographic applications, electrophotographic recording, organic memory devices, alignment layers, biosensors, biochips, or for detecting and discriminating DNA sequences.

The invention further relates to an optical, electrooptical or electronic device, FET, integrated circuit (IC), TFT, OLED or alignment layer comprising a semiconducting or charge transport material, component or device according to the invention.

The invention further relates to a TFT or TFT array for flat panel displays, radio frequency identification (RFID) tag, electroluminescent display or backlight comprising a semiconducting or charge transport material, component or device or a FET, IC, TFT or OLED according to the invention.

The invention further relates to a security marking or device comprising a FET or an RFID tag according to the invention.

DETAILED DESCRIPTION OF THE INVENTION

The term "regioregular" means a polymer with a regioregularity of at least 85%. "Regioregularity" means the number of head-to-tail couplings (HT-diads) of repeating units in the polymer, divided by the number of total couplings, and expressed as a percentage. Preferred are polymers with a regioregularity of 90% or higher, very preferably 95% or higher, more preferably from 96% to 100%, most preferably from 98% to 100%.

The term "catalytic amount" means an amount that is clearly below one equivalent of the monomer or educt that is reacted in the process according to the present invention, and preferably means an amount from >0 to 0.5, very preferably from >0 to 0.1, most preferably from >0 to 0.05 equivalents of the monomer or educt.

The term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention a polymer means a compound having >1, preferably >10 repeating units, and an oligomer means a compound with >1 and <20, preferably ≦10, repeating units.

The term "repeating unit" means the constitutional repeating unit (CRU), which is the smallest constitutional unit the repetition of which constitutes a regular macromolecule, a regular oligomer molecule, a regular block or a regular chain (PAC, 1996, 68, 2291).

The term "leaving group" means an atom or group (charged or uncharged) that becomes detached from an atom in what is considered to be the residual or main part of the molecule taking part in a specified reaction (see also PAC, 1994, 66, 1134).

The term "pi-conjugated" means a compound containing mainly C atoms with $sp^2$-hybridisation (or optionally also sp-hybridisation), which may also be replaced by hetero atoms. In the simplest case this is for example a compound with alternating C—C single and double (or triple) bonds, but does also include compounds with units like 1,3-phenylene. "Mainly" means in this connection that a compound with naturally (spontaneously) occurring defects, which may lead to interruption of the conjugation, is still regarded as a conjugated compound.

Unless stated otherwise, the molecular weight is given as the number average molecular weight $M_n$ determined by gel permeation chromatography (GPC) against polystyrene standards. The degree of polymerization (n) means the number average degree of polymerization, given as $n=M_n/M_U$, wherein $M_U$ is the molecular weight of the single repeating unit (usually without considering the end groups of the polymer which are not part of the repeating unit, like groups $X^{21}$ and $X^{22}$ in formula I1).

Room temperature ("RT"), unless stated otherwise, means 20° C.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be linear or branched. The $C_1$-$C_{40}$ carbyl or hydrocarbyl group includes for example: a $C_1$-$C_{40}$ alkyl group, a $C_2$-$C_{40}$ alkenyl group, a $C_2$-$C_{40}$ alkynyl group, a $C_3$-$C_{40}$ alkyl group, a $C_4$-$C_{40}$ alkyldienyl group, a $C_4$-$C_{40}$ polyenyl group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ alkyl group, a $C_4$-$C_{20}$ alkyldienyl group, a $C_6$-$C_{12}$ aryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Aryl and heteroaryl preferably denote a mono-, bi- or tricyclic aromatic or heteroaromatic group with up to 25 C atoms that may also comprise condensed rings and is optionally substituted with one or more groups L, wherein L is halogen or an alkyl, alkoxy, alkylcarbonyl or alkoxycarbonyl group with 1 to 12 C atoms, wherein one or more H atoms may be replaced by F or Cl.

Especially preferred aryl and heteroaryl groups are phenyl in which, in addition, one or more CH groups may be replaced by N, naphthalene, thiophene, selenophene thienothiophene, dithienothiophene, fluorene and oxazole, all of which can be unsubstituted, mono- or polysubstituted with L as defined above.

In formula I and II R is preferably H.

In formula I and II $R^1$ preferably denotes straight chain, branched or cyclic alkyl with 1 to 20 C-atoms, which is unsubstituted or mono- or polysubstituted by F, Cl, Br or I, and wherein one or more non-adjacent $CH_2$ groups are optionally replaced, in each case independently from one another, by —O—, —S—, —$NR^0$—, —$SiR^0R^{00}$—, —$CY^1$=$CY^2$— or —C≡C— in such a manner that O and/or S atoms are not linked directly to one another, or denotes optionally substituted aryl or heteroaryl preferably having 1 to 30 C-atoms, or P-Sp, with $R^0$ and $R^{00}$ being independently of each other H or alkyl with 1 to 12 C-atoms, $Y^1$ and $Y^2$ being independently of each other H, F, Cl or CN, P being a polymerisable or reactive group which is optionally protected, and Sp being a spacer group or a single bond.

If $R^1$ is an alkyl or alkoxy radical, i.e. where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If $R^1$ is an alkyl group wherein one or more $CH_2$ groups are replaced by —CH=CH—, this may be straight-chain or branched. It is preferably straight-chain, has 2 to 12 C-atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl, undec-1-, 2-, 3-, 4-, 5-, 6-, 7-, 8-, 9- or undec-10-enyl, dodec-1-, 2-, 3-, 4-, 5-, 6-, 7-, 8-, -9, -10 or undec-11-enyl. The alkenyl group may comprise C=C-bonds with E- or Z-configuration or a mixture thereof.

If $R^1$ is oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

If $R^1$ is thioalkyl, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

If $R^1$ is fluoroalkyl, it is preferably straight-chain perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$.

Very preferably $R^1$ is selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-amino or $C_1$-$C_{20}$-fluoroalkyl, in particular from alkenyl, alkynyl, alkoxy, thioalkyl or fluoroalkyl, all of which are straight-chain and have 1 to 12, preferably 5 to 12 C-atoms, most preferably pentyl, hexyl, heptyl, octyl, nonyl, decyl, undecyl or dodecyl.

—$CY^1$=$CY^2$— is preferably —CH=CH—, —CF=CF— or —CH=C(CN)—.

The polymers may also be substituted in 3-position with a polymerisable or reactive group, which is optionally protected during the process of forming the polymer. Particular preferred polymers of this type are those of formula I wherein $R^1$ denotes P-Sp. These polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

Preferably the polymerisable or reactive group P is selected from $CH_2$=$CW^1$—COO—, $CH_2$=$CW^1$—CO—,

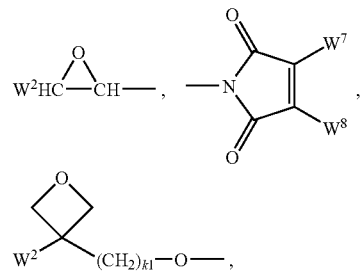

$CH_2$=$CW^2$—$(O)_{k1}$—, $CH_3$—CH=CH—O—, $(CH_2$=CH$)_2$ CH—OCO—, $(CH_1$=CH—$CH_2)_2$CH—OCO—, $(CH_2$=CH$)_2$CH—O—, $(CH_2$=CH—$CH_2)_2$N—, $(CH_2$=CH—$CH_2)_2$N—CO—, HO—$CW^2W^3$—, HS—$CW^2W^3$—, $HW^2$N—, HO—$CW^2W^3$—NH—, $CH_2$=$CW^1$—CO—NH—, $CH_2$=CH—$(COO)_{k1}$-Phe-$(O)_{k2}$—, $CH_2$=CH—$(CO)_{k1}$-Phe-$(O)_{k2}$—, Phe-CH=CH—, HOOC—, OCN—, and $W^4W^5W^6$Si—, with $W^1$ being H, Cl, CN, $CF_3$, phenyl or alkyl with 1 to 5 C-atoms, in particular H, Cl or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, and $k_1$ and $k_2$ being independently of each other 0 or 1.

Alternatively P is a protected derivative of these groups which is non-reactive under the conditions described for the process according to the present invention. Suitable protective groups are known to the expert and described in the literature, for example in Green, "Protective Groups in Organic Synthesis", John Wiley and Sons, New York (1981), like for example acetals or ketals.

Especially preferred groups P are $CH_2$=CH—COO—, $CH_2$=$C(CH_3)$—COO—, $CH_2$=CH—, $CH_2$=CH—O—, $(CH_2$=CH$)_2$CH—OCO—, $(CH_2$=CH$)_2$CH—O—,

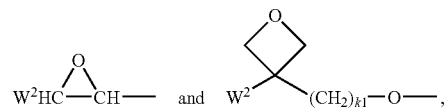

or protected derivatives thereof.

Polymerisation of group P can be carried out according to methods that are known the expert and described in the literature, for example in D. J. Broer; G. Challa; G. N. Mol, *Macromol. Chem.*, 1991, 192, 59.

The term "spacer group" is known in prior art and suitable spacer groups Sp are known to the ordinary expert (see e.g. Pure Appl. Chem. 73(5), 888 (2001). The spacer group Sp is preferably of formula Sp'-X', such that P-Sp- is P-Sp'-X'—, wherein Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X' is —O—, —S—, —CO—, —COO—, —OCO—, —O—COO—, —CO—NR$^0$—, —NR$^0$—CO—, —NR$^0$—CO—NR$^{00}$—, —OCH$_2$—, —CH$_2$O—, —SCH$_2$—, —CH$_2$S—, —CF$_2$O—, —OCF$_2$—, —CF$_2$S—, —SCF$_2$—, —CF$_2$CH$_2$—, —CH$_2$CF$_2$—, —CF$_2$CF$_2$—, —CH=N—, —N=CH—, —N=N—, —CH=CR$^0$—, —CY$^1$=CY$^2$—, —C≡C—, —CH=CH—COO—, —OCO—CH=CH— or a single bond, R$^0$ and R$^{00}$ are independently of each other H or alkyl with 1 to 12 C-atoms, and Y$^1$ and Y$^2$ are independently of each other H, F, Cl or CN.

X' is preferably —O—, —S—, —OCH$_2$—, —CH$_2$O—, —SCH$_2$—, —CH$_2$S—, —CF$_2$O—, —OCF$_2$—, —CF$_2$S—, —SCF$_2$—, —CH$_2$CH$_2$—, —CF$_2$CH$_2$—, —CH$_2$CF$_2$—, —CF$_2$CF$_2$—, —CH=N—, —N=CH—, —N=N—, —CH=CR$^0$—, —CY$^1$=CY$^2$—, —C≡C— or a single bond, in particular —O—, —S—, —C≡C—, —CY$^1$=CY$^2$— or a single bond. In another preferred embodiment X' is a group that is able to form a conjugated system, such as —C≡C— or —CY$^1$=CY$^2$—, or a single bond.

Typical groups Sp' are, for example, —(CH$_2$)$_p$—, —(CH$_2$CH$_2$O)$_q$—CH$_2$CH$_2$—, —CH$_2$CH$_2$—S—CH$_2$CH$_2$— or —CH$_2$CH$_2$—NH—CH$_2$CH$_2$— or —(SiR$^0$R$^{00}$—O)$_p$—, with p being an integer from 2 to 12, q being an integer from 1 to 3 and R$^0$ and R$^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

Suitable leaving groups are for example those typically used for Grignard reactions, which are known to the skilled person. Preferred leaving groups are selected from halogen, preferably Br, Cl or I, most preferably Br or Cl.

In formula II X$^1$ and X$^2$ are identical or different leaving groups as defined above, preferably selected form halogen, very preferably Br, Cl or I, most preferably Br. Preferably X$^1$ and X$^2$ are identical. In another preferred embodiment of the present invention one of X$^1$ and X$^2$ is Br and the other is Cl.

The activator used in step b) is an aromatic monomer or oligomer, preferably a pi-conjugated compound.

Preferably the activator is a compound that comprises one or more aromatic rings that are linked directly or via a group selected from —CH=CR$^0$—, —CY$^1$=CY$^2$—, —C≡C—, with R$^0$ and Y$^{1,2}$ being as defined above, and/or comprises one or more fused aromatic rings, all of these rings optionally being substituted, preferably with one or more groups L as defined above. Preferred aromatic rings are selected from phenyl in which, in addition, one or more CH groups may be replaced by N, naphthalene, thiophene, selenophene, thienothiophene, dithienothiophene, fluorene and oxazole.

If the activator is an oligomer, it preferably comprises 2 to 10, very preferably 2, 3, 4 or 5 repeating units, each of which may comprise one or more rings as defined above.

Preferably the activator is of formula III

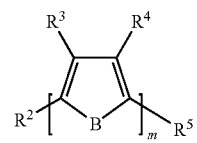

wherein

B is in each occurrence independently of one another S, Se or CR$^6$=CR$^7$,

R$^{2-7}$ independently of each other have one of the meanings of R, R$^1$ or X$^1$ as defined in formula I or of the preferred meanings given above, with at least one of R$^{2-7}$ having one of the meanings of X$^1$, and m is an integer from 1 to 10.

R$^{2-7}$ in formula III preferably denote H or have independently of each other one of the preferred meanings of R$^1$ given above. If one or more of R$^{1-7}$ denote X$^1$, they preferably have independently of each other one of the preferred meanings of X$^1$ and X$^2$ given above.

Especially preferred compounds of formula III are those wherein B is S or Se, those wherein R$^2$ and/or R$^5$ denote X$^1$, those wherein R$^3$ and R$^4$ denote H, those wherein one of R$^3$ and R$^4$ is H and the other is R$^1$ as defined above, those wherein m is 1, 2, 3, 4 or 5, very preferably 1 or 2, or combinations of these.

Very preferably the activator used in step b) and the educt used in step a) comprise the same type of rings (i.e. either thiophene or selenophene).

Most preferably the activator used in step b) is selected from the following formulae:

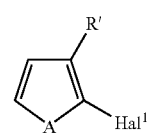

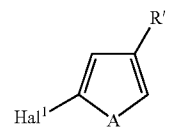

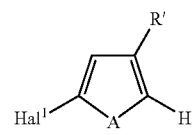

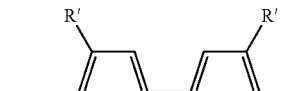

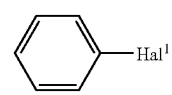

wherein A is S or Se, Hal$^1$ and Hal$^2$ are identical or different Halogen atoms, preferably Br or Cl, and R' has one of the meanings given for R$^1$ and is preferably H, alkyl or fluoroalkyl with 1 to 12 C atoms.

In another preferred embodiment the activator used in step b) has the same structure as the educt used in step a).

The organomagnesium halide used in step a1) is preferably selected of formula IV:

$$R^8\text{—Mg—}X^1 \qquad \text{IV}$$

wherein $R^8$ is straight chain, branched or cyclic alkyl with 1 to 20 C-atoms, which is unsubstituted or mono- or polysubstituted by F, Cl, Br or I, and wherein one or more non-adjacent $CH_2$ groups are optionally replaced, in each case independently from one another, by —O—, —S—, —$NR^O$—, —$SiR^O R^{OO}$—, —$CY^1$=$CY^2$— or —C≡C— in such a manner that O and/or S atoms are not linked directly to one another, or aryl or heteroaryl which is optionally substituted by one or more groups L, L is F, Cl, Br, I or alkyl, alkoxy or thioalkyl with 1 to 20 C atoms, wherein one or more H atoms may be substituted by F or Cl, $X^1$ is as defined in formula II, and $Y^1$, $Y^2$, $R^O$ and $R^{OO}$ are as defined above.

If $R^8$ is an alkyl group it may be straight-chain or branched. It is preferably straight-chain, has 2, 3, 4, 5, 6, 7 or 8 carbon atoms and accordingly is preferably methyl, ethyl, propyl, butyl, pentyl, hexyl, heptyl, octyl, nonyl, decyl, undecyl, dodecyl, tridecyl, tetradecyl, or pentadecyl, for example.

If $R^8$ is an alkyl group wherein one or more $CH_2$ groups are replaced by —CH=CH—, this may be straight-chain or branched. It is preferably straight-chain, has 2 to 10 C-atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

$R^8$ can also be a chiral group like for example 2-butyl (=1-methylpropyl), 2-methylbutyl, 2-methylpentyl, 3-methylpentyl, 2-ethylhexyl, 2-propylpentyl, 4-methylhexyl, 2-hexyl, 2-octyl, 2-nonyl, 2-decyl, 2-dodecyl, 1,1,1-trifluoro-2-octyl, 1,1,1-trifluoro-2-hexyl or an achiral branched group like for example isopropyl, isobutyl (=methylpropyl) or iso-pentyl (=3-methylbutyl).

If $R^8$ is aryl or heteroaryl it is preferably selected from phenyl, benzyl, fluorinated phenyl, pyridine, pyrimidine, biphenyl, naphthalene, thiophene, selenophene, fluorinated thiophene, benzo[1,2-b:4,5-b']dithiophene, thiazole and oxazole, all of which are unsubstituted, mono- or polysubstituted with L as defined above.

Very preferably $R^8$ is straight-chain or branched alkyl or alkenyl with 1 to 12 C atoms, phenyl or benzyl, in particular vinyl, butyl, propyl or isopropyl.

The process according to the present invention is characterized in that a Ni(0) catalyst is used, instead of a Ni(II) catalyst as described in the methods of prior art. The use of Ni(0) instead of Ni(II) avoids a pre-reduction step in the reaction mechanism. Thus, in the methods according to prior art the Ni(II) is only active once it has been reduced in situ to a Ni(0) catalyst, which occurs by the oxidative coupling of two thiophene organomagnesium intermediates to afford an undesired tail-to-tail (TT) isomer. In contrast, in the process according to the present invention a Ni(0) catalyst is used, so that an undesired TT coupling can be avoided.

The process according to the present invention is further characterized in that the Ni(0) catalyst is activated in a separate step b). If the Ni(0) compound and the bidentate ligand would be added directly to the intermediate mixture obtained by step a) as described in prior art, then the activation of the catalyst would be carried out in situ by remaining educt in the Grignard intermediate mixture. As a consequence, since the activation reaction does not proceed much faster than the polymerisation reaction, the chain starting reactions in the mixture and hence the molecular weight of the resulting polymer would be less controllable. In contrast, if the activation of the Ni(0) catalyst is carried out in a separate step as described in the present invention, the chain starting reactions and thereby the molecular weight of the resulting polymer can be better controlled.

The process according to the present invention is exemplarily illustrated in Scheme 1 below. The exact reaction conditions for each step may be varied by the skilled person based on general knowledge.

Scheme 1:

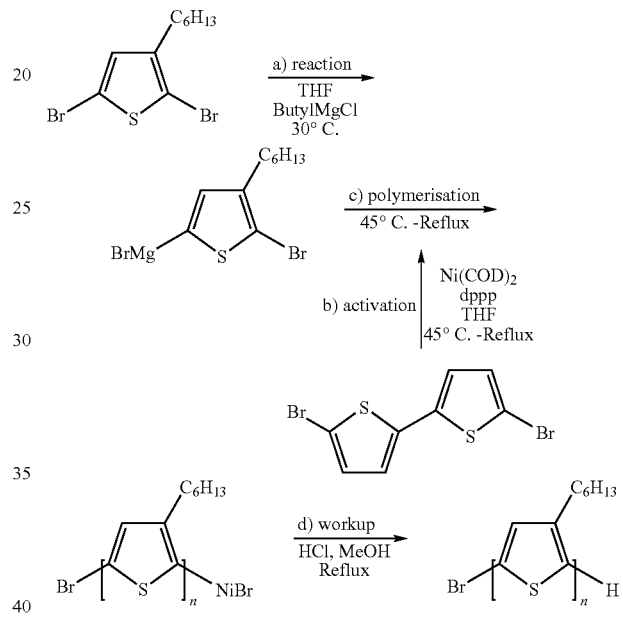

In the first step (step a), a 3-substituted thiophene or selenophene having leaving groups in 2- and/or 5-position ("educt") is reacted with an organic magnesium halide or with magnesium or with reactive zinc. The educt is preferably a compound of formula II as defined above.

In a first preferred embodiment, the educt is reacted with an organomagnesium halide (step a1). The organomagnesium halide is preferably selected of formula IV as defined above.

Preferably the educt is dissolved in an organic solvent, and the organomagnesium halide is added to the solution, very preferably under an inert gas atmosphere, preferably at a temperature between 0° C. and 25° C. Alternatively the organomagnesium halide is dissolved in an organic solvent and the educt added to the solution. The compound to be added to the solution can itself also be dissolved in the solvent, and the two solutions then be combined. The organomagnesium halide is preferably added in a ratio of 0.9 to 1.05 equivalents with respect to the educt, most preferably between 0.95 and 0.98.

Suitable and preferred solvents are selected from linear or cyclic organic ethers. Preferred solvents include, without limitation, linear ethers like diethyl ether, or cyclic ethers like THF, 2-methyltetrahydrofuran, tetrahydropyran or dioxane. Aromatic ethers, like diphenyl ether, can also be used. It is also possible to use a mixture of two or more solvents.

The addition of the reactants is preferably carried out in the absence of oxygen and water, for example under an inert gas atmosphere like nitrogen or argon. The temperature can be any temperature between 0° C. and solvent reflux. Preferably the reactants are added to each other at 0° C. or RT.

The educt reacts with the organomagnesium halide to form a Grignard intermediate product. The reaction conditions (solvent, temperature, atmosphere) are as described above. Typically the reaction mixture is stirred for a given period of time, for example 5 minutes to 1 hour, at a temperature between 0° C. and 25° C. and then optionally heated at reflux for a given period of time, for example from 10 minutes to 2 hours. Other reaction times or conditions can be selected by the skilled person based on general knowledge.

The educt and the organomagnesium halide react into a Grignard intermediate product, which is usually a mixture of regiochemical isomers of formula Va and Vb and may also include a, typically small, amount of the double-Grignard product of formula Vc:

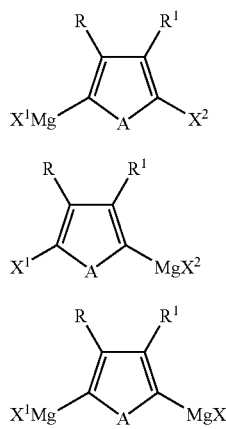

wherein A, R, $X^1$, $X^2$ and $R^1$ have the meanings of formula II.

The ratio of the intermediates is depending on the reaction conditions, for example the ratio of educt and organomagnesium halide, the solvent, temperature and reaction time. Under the reaction conditions as described above, the ratio of intermediates of formula Va and Vb is usually 90% or higher, more typically 95% or higher. The ratio Va to Vb is typically between 3:1 to 5:1.

A second preferred embodiment relates to a process wherein in the first step (step a2) the organomagnesium intermediate, or the mixture of intermediates of formula Va-c, is generated by using pure magnesium instead of an organomagnesium halide, in analogy to the process described in WO 2005/014691 A2. For example the reaction of a 2,5-dibromo-3-alkylthiophene with magnesium metal in an organic solvent under the conditions described in WO 2005/014691 A2 yields a thiophene organomagnesium intermediate, or a mixture of intermediates, which are polymerised in a second step in the presence of the Ni(0) catalyst as described above and below.

A third preferred embodiment relates to a process wherein in the first step (step a3), instead of an organomagnesium intermediate, an organozinc intermediate, or a mixture of organozinc intermediates, are generated by reacting the educt with reactive zinc, for example "Rieke zinc", in analogy to the process described for example in WO 93/15086 A1.

A fourth preferred embodiment relates to a process wherein in the first step (step a4), an organomagnesium intermediate or a mixture of organomagnesium intermediates is prepared as described in step a1) or step a2), and then an organozinc intermediate or a mixture of organozinc intermediates is prepared by transmetallation of the organomagnesium intermediate(s) with a zinc dihalide, like e.g. $ZnCl_2$. This can be achieved by methods that are known to the person skilled in the art and are described in the literature (see for example E. Nakamura in *Organometallics in Synthesis. A Manual*, M. Schlosser (Ed.), Chichester, Wiley, 2002).

In the second step (step b, activation step), a catalytic amount of a Ni(0) compound and a bidentate ligand are reacted with a monomeric or oligomeric thiophene or selenophene having leaving groups in 2- and/or 5-position ("activator"). The activator is preferably a compound of formula III as defined above. For example, one of the reactants, e.g. the activator, is dissolved in an organic solvent, and the other reactants, e.g. the Ni(0) compound and the ligand, are added to the solution. Alternatively, each of the reactants can be dissolved in an organic solvent, and the resulting solutions then be combined in a suitable way.

The addition of the reactants is preferably carried out in the absence of oxygen and water, for example under an inert gas atmosphere like nitrogen or argon. The temperature can be any temperature between 0° C. and solvent reflux. Preferably the reactants are added to each other at 55-65° C.

The activator reacts with the Ni(0) compound and the bidentate ligand to form an activated Ni(0) catalyst complex. If the activator is a 2- and/or 5-(di)halo thiophene or selenophene, the reaction proceeds by oxidative addition of the Ni(0) catalyst to the thiophene (selenophene) halide bond.

The reaction conditions (solvent, temperature, atmosphere) can be chosen as described above. Typically the reaction mixture is stirred for a given period of time, for example 5 minutes to 1 hour, at a temperature between 0° C. and 25° C. and then heated at reflux for a given period of time, for example from 10 minutes to 2 hours. Other reaction times or conditions can be selected by the skilled person based on general knowledge.

The solvent is preferably selected from the solvents as described for step a) above. Preferably the solvent used in step b) is of the same type as the solvent used in step a).

The organic bidentate ligand is preferably a phosphine ligand. Principally any bidentate phosphine ligand known to the skilled person can be used. Suitable and preferred phosphine ligands include, without limitation, 1,2-bis(diphenylphosphino)ethane (dppe), 1,3-bis(diphenylphosphino)propane (dppp), 1,4-bis(diphenylphosphino)butane (dppb), 1,1'-bis(diphenylphosphino)ferrocene (dppf), 2,2'-bis(diphenylphosphino)-1,1'-binaphthyl (BINAP), and 1,2-bis(dicylohexylphosphino)ethane.

As nickel catalyst principally any Nickel (0) catalyst known to the skilled person can be used. Suitable and preferred catalysts include, without limitation, organic Ni (0) compounds or complexes like $Ni(COD)_2$ or nickel (0) tetracarbonyl $[Ni(CO)_4]$.

The activated Ni(0) catalyst obtained by step b) is used in step c) preferably in a catalytic amount relative to the educt of step a). Therefore, it is preferred to react the Ni(0) compound, bidentate ligand and activator in step b) also in catalytic amounts, so that the reaction mixtures from step b) and a) can be directly combined. However, it is also possible to use a higher amount of reactants in step b), and then only to combine a part of the reaction mixture from step b) with the reaction mixture from step a).

The ratio of bidentate ligand to Ni (0) catalyst is preferably from 10:1 to 0.1:1, very preferably from 5:1 to 1:1, most preferably 1:1.

The ratio of Ni(0) catalyst to activator is preferably 1:5 to 1:0.5, very preferably from 1:2 to 1:1, most preferably 1.1:1.

In the third step (step c, polymerisation step), the reaction mixture of step a), comprising the organomagnesium intermediate or organozinc intermediate, or the mixture of intermediates, is brought into contact with the activated catalyst mixture of step b). "Bring into contact" means for example that the catalyst mixture is added to the intermediate mixture or vice versa. The two mixtures are preferably brought into contact under conditions as described above, very preferably at a temperature from 0° C. to reflux, most preferably at 25° C. to 50° C.

The activated catalyst mixture is preferably added in such an amount that the ratio of Ni(0) is 0.001 to 10 mol %, very preferably 0.01 to 3 mol %, most preferably 0.5 to 2.5 mol % of the thiophene educt of step a).

The activated catalyst system initiates the polymerization reaction. The reaction is preferably carried out under conditions as described above, including stirring or otherwise agitating the reaction mixture, applying an inert gas atmosphere, keeping the temperature typically from 0° C. to reflux, preferably at reflux, for a time from several minutes to several hours or days, typically from 1 to 10 hours.

As mentioned above the activation reaction in step b) proceeded by oxidative addition of the Ni(0) catalyst to the thiophene (selenophene) halide bond of the activator. In step c), subsequent nucleophillic displacement of the halide by a thiophene (selenophene) organomagnesium reagent, and reductive elimination of the Ni(0) generates the thiophene-thiophene (selenophene-selenophene) bond in the forming polymer chain, and regenerates the active Ni(0) catalyst.

In the fourth step (step d, workup), the polymerisation reaction is terminated, for example by addition of an acid and an alcohol, e.g. methanol, and the polymer is typically isolated from the reaction mixture and purified according to standard procecures known to skilled person.

In the process according to the present invention, a high percentage of intermediates of formula Va, or the corresponding organozinc intermediates, will lead to a high amount of HT-couplings in the polymer as illustrated by formula Ia

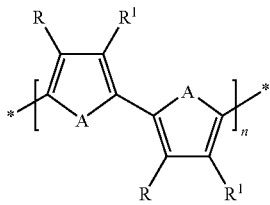

Ia wherein A, R, $R^1$ and n have the meanings given above.

The regioregularity in the polymers according to the present invention is preferably at least 85%, in particular 90% or higher, very preferably 95% or higher, most preferably from 96 to 100%.

The polymers according to the present invention preferably have a degree of polymerisation (number of repeating units) n>10, in particular n>50, very preferably n>100. Furthermore, the polymers according to the present invention preferably have a degree of polymerisation n<5,000, in particular n<2,000, very preferably n<1,500. Most preferably n is from above 100 to 500.

The polymers according to the present invention preferably a number average molecular weight $M_n$ from 5,000 to 300,000, in particular from 10,000 to 70,000.

In another preferred embodiment of the present invention, the terminal groups of the polymer are chemically modified ("endcapped") during or after polymerisation. Endcapping can be carried out before or after recovering the polymer from the polymerisation reaction mixture, before or after work-up of the polymer or before or after its purification, depending on which is more suitable and more effective regarding the material costs, time and reaction conditions involved. For example, in case expensive co-reactants are used for endcapping it may be more economical to carry out the endcapping after purification of the polymer. In case the purification effort is economically more important than the co-reactants it may be preferred to carry out the endcapping before purification or even before recovering the polymer from the polymerisation reaction mixture.

Suitable endcapping methods are known to the skilled person and are described for example in U.S. Pat. No. 6,602,974, WO 2005/014691 or WO2006/010267. Furthermore, endcapping can be carried out as described below.

As a result of the process according to the present invention, at the end of the polymerisation step the end groups ($X^1$ and $X^2$) are usually either a halogen or a Grignard group. Also, small amounts of endgroups $R^8$ can be present as a result of a reaction with the byproduct $R^8X^2$ from the preparation of the thiophene intermediate. For endcapping, typically an aliphatic Grignard reagent R"MgX or dialkyl Grignard reagent $MgR"_2$, wherein X is halogen and R" is an aliphatic group, or active magnesium is added to convert the remaining halogen end groups to Grignard groups. Subsequently, for example to give an alkyl end group an excess of an ω-haloalkane is added which will couple to the Grignard. Alternatively, to give a proton end group the polymerisation is quenched into a non-solvent such as an alcohol.

To provide reactive functional end groups, like for example hydroxyl or amine groups or protected versions thereof, the halogen end groups are for example reacted with a Grignard reagent R'''MgX, wherein R''' is such a reactive functional group or protected reactive functional group.

Instead of a Grignard reagent it is also possible to carry out endcapping using an organo lithium reagent, followed by addition of an ω-haloalkane.

It is also possible to replace H end groups by reactive functional groups by using e.g. the methods described in U.S. Pat. No. 6,602,974, such as a Vilsmeier reaction to introduce aldehyde groups followed by reduction with metal hydrides to form hydroxyl groups.

If the polymer has been fully worked up prior to endcapping, it is preferred to dissolve the polymer in a good solvent for Grignard coupling such as diethyl ether or THF. The solution is then treated for example with the above mentioned organo Grignard reagent R"MgX or $MgR"_2$ or R'''MgX or with a zinc reagent, R"ZnX, R'''ZnX or $ZnR"_2$, where R" and R''' are as defined above. A suitable nickel or palladium catalyst is then added along with the haloalkane.

Very preferred are endcapped polymers wherein the terminal groups during or after polymerisation are replaced by H or an alkyl group.

Preferably endcapping is carried out before purification of the polymer. Further preferably endcapping is carried out after step d) of the process as described above and below. In another preferred embodiment of the present invention the endcapper is added during the polymerisation reaction to remove the end groups and further control the molecular weight of the polymer.

Preferably, substantially all molecules in a polymer sample are endcapped in accordance with this invention, but at least 80%, preferably at least 90%, most preferably at least 98% are endcapped.

By chemical modification of the terminal groups (endcapping) of the polymers according to the present invention, it is possible to prepare novel polymers with different terminal groups. These polymers are preferably selected of formula I1

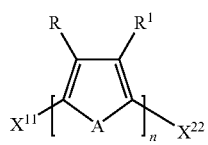

I1 wherein A, R, n and $R^1$ have the meanings given in formula I and II, and $X^{11}$ and $X^{22}$ are independently of each other H, halogen, stannate, boronate or an aliphatic, cycloaliphatic or aromatic group that may also comprise one or more hetero atoms.

Especially preferably $X^{11}$ and $X^{22}$ are selected from H or straight-chain or branched alkyl with 1 to 20, preferably 1 to 12, very preferably 1 to 6 C-atoms, most preferably straight-chain alkyl or branched alkyl like isopropyl or tert. butyl. Aromatic groups $X^{11}$ and $X^{22}$ tend to be bulky and are less preferred.

As described above, the end groups $X^{11}$ and $X^{22}$ are preferably introduced by reacting the polymer of formula I1 with a Grignard reagent MgR"X, $MgR''_2$ or MgR'''X as described above, wherein R" and R''' are $X^{11}$ or $X^{22}$ as defined in formula I2.

By introducing suitable functional end groups $X^{11}$ and/or $X^{22}$ it is possible to prepare block copolymers from the polymers according to the present invention. For example, if one or both of the end groups $X^{11}$ and $X^{22}$ in a polymer of formula I2 is a reactive group or a protected reactive group, like for example an optionally protected hydroxy or amine group, they can be reacted (after removing the protective group) with the end group of another polymer of formula I2 (e.g. with different groups $R^1$ and/or $X^{11}$ and/or $X^{22}$), or with a polymer of different structure. If one of $X^{11}$ and $X^{22}$ is a reactive group, diblock copolymers can be formed. If both $X^{11}$ and $X^{22}$ are reactive groups, a triblock copolymer can be formed.

Alternatively a block copolymer can be formed by introducing reactive or protected reactive groups $X^{11}$ and/or $X^{22}$, adding a catalyst and one or more monomers, and initiating a new polymerization reaction starting from the site of the groups $X^{11}$ and/or $X^{22}$.

Suitable functional end groups and methods of their introduction can be taken from the above disclosure and from prior art. Details how to prepare block copolymers can also be taken e.g. from U.S. Pat. No. 6,602,974.

The polymers of the present invention are useful as optical, electronic and semiconductor materials, in particular as charge transport materials in field effect transistors (FETs), e.g., as components of integrated circuitry, ID tags or TFT applications. Alternatively, they may be used in organic light emitting diodes (OLEDs) in electroluminescent display applications or as backlight of, e.g., liquid crystal displays, as photovoltaics or sensor materials, for electrophotographic recording, and for other semiconductor applications.

The polymers according to the present invention show especially advantageous solubility properties which allow production processes using solutions of these compounds. Thus films, including layers and coatings, may be generated by low cost production techniques, e.g., spin coating. Suitable solvents or solvent mixtures comprise alkanes and/or aromatics, especially their fluorinated or chlorinated derivatives.

A solution or formulation comprising one or more polymers and one or more solvents is another aspect of the invention. The formulation can additionally comprise one or more other suitable components or additives selected for example from catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colourants, dyes, pigments or nanoparticles.

The polymers of the present invention are especially useful as charge transport materials in FETs. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the solubility properties of the compounds according to the invention and thus the processibility of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with money value, like stamps, tickets, shares, cheques etc.

Alternatively, the polymers according to the invention may be used in organic light emitting devices or diodes (OLEDs), e.g., in display applications or as backlight of e.g. liquid crystal displays. Common OLEDs are realized using multi-layer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the polymers according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the polymers according to the present invention, especially those which show photoluminescent properties, may be employed as materials of light sources, e.g., of display devices such as described in EP 0 889 350 A1 or by C. Weder et al., Science, 279, 1998, 835-837.

A further aspect of the invention relates to both the oxidised and reduced form of the polymers according to this invention. Either loss or gain of electrons results in formation of a highly delocalised ionic form, which is of high conductivity. This can occur on exposure to common dopants. Suitable dopants and methods of doping are known to those skilled in the art, e.g., from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$ $(BF_4^-)$, $AgClO_4$, $H_2IrCl_6$, La $(NO_3)_3.6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the polymers of the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

The examples below shall illustrate the invention without limiting it.

Example 1

21.32 g of 2,5-dibromo-3-hexylthiophene are dissolved in 125.4 g of THF under nitrogen, followed by addition of 32.58 g of a solution of n-butylmagnesiumchloride in THF (~2 M) to generate a Grignard mixture, which is heated to 56° C.

In parallel 220 mg of 5,5'-dibromo-2,2'-bithiophene are dissolved in 10 ml of THF in a separate vessel under nitrogen. 271 mg of dppp and 180 mg of Ni(COD)$_2$ are added, respectively, and 7 ml of THF are used to rinse each time. After stirring the catalyst mixture at 60° C. for 1 hour it is added to the above-mentioned Grignard mixture.

The polymerisation mixture is heated to reflux for 2.5 hours, then 80 ml of HCl (1 M) and 200 ml of methanol are added, respectively, at 56° C. After cooling the mixture to 23° C. the solid crude product is filtered off and rinsed with methanol. The solid is dissolved in 120 ml of chlorobenzene at 55° C., and addition of a mixture of 180 ml of methanol and 20 ml of HCl (1 M) results in precipitation of the product. After cooling to 23° C. the polymer is filtered off and washed with 800 ml of n-heptane at 75° C.

Yield: 9.86 g (90.0%), NMR: 97.2% HT-couplings, Elemental analysis Mg=30 µg/g, Ni=31 µg/g GPC: Mn=34,007, Mw=62,638, Mp=55,864, D=1.84.

Example 2

2.30 kg of 2,5-dibromo-3-hexylthiophene are dissolved in 28 kg of THF under nitrogen, followed by addition of 3.3 kg of a solution of n-butylmagnesium chloride in THF (~2 M) to generate a Grignard mixture, which is heated to 40° C.

In parallel 46 g of 5,5'-dibromo-2,2'-bithiophene are dissolved in 2050 g of THF in a separate vessel under nitrogen. 29 g of dppp and 19 g of Ni(COD)$_2$ are added, respectively. After stirring the catalyst mixture at 60° C. for 10 min it is added to the above-mentioned Grignard mixture.

The polymerisation mixture is heated to reflux for 2 hours, then 2 kg of HCl (25%) and 2 kg water are added, followed by 28 kg of methanol at 56° C. After cooling the mixture to 23° C. the solid crude product is filtered off and rinsed with methanol. The solid is dissolved in 22 kg of chlorobenzene at 55° C., and addition of a mixture of 25 kg of methanol 1 kg of HCl (25%) and 1 kg of water results in precipitation of the product. After cooling to 23° C. the polymer is filtered off and washed with 50 kg of n-heptane at 75° C.

Yield: 966 g (81.7%), NMR: 95.7% HT-couplings, Elemental analysis Mg=0.25 µg/g, Ni=6 µg/g GPC: Mn=40,700, Mw=78,570, Mp=51,770, D=1.93.

Example 3

3.50 kg of 2,5-dibromo-3-hexylthiophene are dissolved in 18 kg of THF under nitrogen, followed by addition of 5.1 kg of a solution of n-butylmagnesium chloride in THF (~2 M) to generate a Grignard mixture, which is heated to 25° C.

In parallel 87 g of 2,5-dibromo-3-hexylthiophene are dissolved in 7.5 kg of THF in a separate vessel under nitrogen. 112 g of dppp and 73 g of Ni(COD)$_2$ are added, respectively. After stirring the catalyst mixture at 60° C. for 10 min it is cooled to 25° C. and added to the above-mentioned Grignard mixture.

The polymerisation mixture is heated to reflux for 5 min, then 0.7 kg of a solution of n-butylmagnesium chloride in THF (~2 M) are added and refluxed for another 10 min. Then 8.5 kg of HCl (25%) and 40 kg of methanol are added at 56° C.-20° C. Then the solid crude product is filtered off and rinsed with methanol and acetone. The solid is dissolved in 35 kg of chlorobenzene at 55° C., and dropping this solution into a mixture of 70 kg of methanol and 3.5 kg of HCl (25%) results in precipitation of the product. Then the polymer is filtered off and washed with 48 kg of acetone.

Yield: 1.35 kg (73.4%), NMR: 94.7% HT-couplings, Elemental analysis Mg=15 µg/g, Ni=8.5 µg/g GPC: Mn=19,772, Mw=34,074, Mp=32.682, D=1.72.

The invention claimed is:

1. Process for preparing a regioregular poly(3-substituted thiophene) or poly(3-substituted selenophene) by
   a) reacting a 3-substituted thiophene or 3-substituted selenophene each having leaving groups in 2- and 5-position ("educt") with magnesium or reactive zinc or an organomagnesium halide,
   b) reacting a Ni(0) catalyst and a bidentate ligand with an aromatic monomer or oligomer having one or more leaving groups ("activator"),
   c) bringing the reaction mixtures resulting from step a) and b) into contact with each other, and optionally agitating and/or heating the resulting mixture, thereby starting a polymerisation reaction, d) optionally adding a reagent that stops the polymerisation reaction, and optionally recovering the polymer from the reaction mixture.

2. Process according to claim 1 for preparing a regioregular polymer of formula I

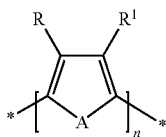

wherein A is S or Se, R is H or F, n is an integer>1, and $R^1$ is a carbyl or hydrocarbyl group that optionally comprises one or more hetero atoms and does not react under the conditions described for the process of the present invention, by a) reacting a monomer of formula II ("educt")

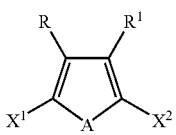

wherein A, R and $R^1$ are as defined in formula I, and $X^1$ and $X^2$ are independently of each other a suitable leaving group, with magnesium or reactive zinc or an organomagnesium halide, whereby an organomagnesium or organozinc intermediate or a mixture of organomagnesium or organozinc intermediates is generated, b) reacting a Ni(0) catalyst and a bidentate ligand with an aromatic monomer or oligomer having one or more leaving groups ("activator"), c) bringing the intermediate or intermediate mixture obtained by step a) into contact with the mixture obtained by step b), and optionally agitating and/or heating the resulting mixture, thereby starting a polymerisation reaction, d) optionally adding a reagent that stops the polymerisation reaction, and optionally recovering the resulting polymer from the mixture.

3. Process according to claim 2, wherein A is S or Se, R is H and $R^1$ is straight chain, branched or cyclic alkyl with 1 to 20 C-atoms, which is unsubstituted or mono- or polysubstituted by F, Cl, Br or I, and wherein one or more non-adjacent $CH_2$ groups are optionally replaced, in each case independently from one another, by —O—, —S—, —$NR^0$—, —$SiR^0R^0$—, —$CY^1$=$CY^2$— or —C≡C— in such a manner that O and/or S atoms are not linked directly to one another, or denotes optionally substituted aryl or heteroaryl preferably having 1 to 30 C-atoms, or P-Sp, with $R^0$ and $R^{00}$ being independently of each other H or alkyl with 1 to 12 C-atoms, $Y^1$ and $Y^2$ being independently of each other H, F or Cl, P being a polymerisable or reactive group which is optionally protected, and Sp being a spacer group or a single bond, and $X^1$ and $X^2$ are identical or different leaving groups selected from Cl, Br and I.

4. Process according to claim 2, characterized in that the organomagnesium halide is selected of formula IV $$R^8-Mg-X^1 \qquad IV$$

wherein $R^8$ is aryl or heteroaryl which is optionally substituted by one or more groups L, or straight chain, branched or cyclic alkyl with 1 to 20 C-atoms, which is unsubstituted or mono- or polysubstituted by F, Cl, Br or I, and wherein one or more non-adjacent $CH_2$ groups are optionally replaced, in each case independently from one another, by —O—, —S—, $NR^0$, —$SiR^0R^{00}$—, —$CY^1$=$CY^2$— or —C≡C— in such a manner that O and/or S atoms are not linked directly to one another, L is F, Cl, Br, I or alkyl, alkoxy or thioalkyl with 1 to 20 C atoms, wherein one or more H atoms may be substituted by F or Cl, $Y^1$ and $Y^2$ are independently of each other H, F, Cl or CN, $R^0$ and $R^{00}$ are independently of each other H, alkyl with 1 to 12 C-atoms or aryl, $X^1$ is as defined in claim 2.

5. Process according to claim 1, characterized by a1) reacting the educt with an organomagnesium halide in an organic solvent, whereby an organomagnesium intermediate is generated, or alternatively a2) reacting the educt with magnesium metal in an organic solvent, whereby an organomagnesium intermediate is generated, or alternatively a3) reacting the educt with reactive zinc in an organic solvent, whereby an organozinc intermediate is generated, or alternatively a4) generating an organomagnesium intermediate as described in step a1) or a2), and reacting said intermediate with a zinc dihalide, whereby an organozinc intermediate is generated, and b) reacting a catalytic amount of a Ni(0) catalyst and a bidentate ligand with the activator, and c) bringing the intermediate or intermediate mixture obtained by one of steps a1)-a4) into contact with the mixture obtained by step b), and optionally agitating and/or heating the resulting mixture, thereby starting a polymerisation reaction, and d) optionally adding a reagent that stops the polymerisation reaction, and optionally recovering the resulting polymer from the mixture.

6. Process according to claim 1, characterized in that the substituent in 3-position of the educt is selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-amino or $C_1$-$C_{20}$-fluoroalkyl.

7. Process according to claim 1, characterized in that the activator is a compound that comprises one or more aromatic rings that are linked directly or via a group selected from —CH=$CR^0$—, —$CY^1$=$CY^2$—, —C≡C—, and/or comprises one or more fused aromatic rings, all of the rings optionally being substituted, wherein $R^0$ is independently of each other H or alkyl with 1 to 12 C atoms and $Y^1$ and $Y^2$ are independently of each other H, F or Cl.

8. Process according to claim 7, characterized in that the activator is selected of formula III

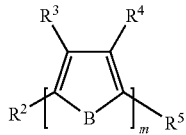

wherein
B is in each occurrence independently of one another S, Se or $CR^6=CR^7$,
$R^{2-7}$ independently of each other have one of the meanings of R, $R^1$ or $X^1$, with at least one of $R^{2-7}$ having one of the meanings of $X^1$, and
m is an integer from 1 to 10.

9. Process according to claim 8, characterized in that the activator is selected of the following formulae

I

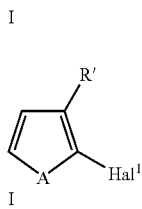

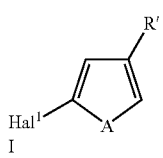

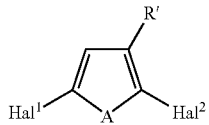

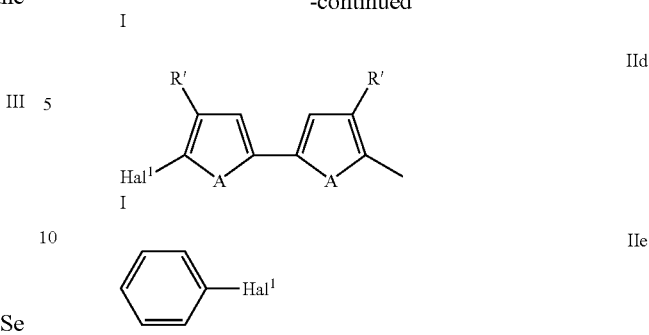

wherein A is S or Se, $Hal^1$ and $Hal^2$ are identical or different Halogen atoms, and
R' is a carbyl or hydrocarbyl group that optionally comprises one or more heteroatoms and does not react under the conditions described for the process of the present invention.

10. Process according to claim 1, characterized in that the bidentate ligand is a phosphine ligand.

11. Process according to claim 10, characterized in that the bidentate ligand is selected from 1,2-bis(diphenylphosphino)ethane (dppe), 1,3-bis(diphenylphosphino)propane (dppp), 1,4-bis(diphenylphosphino)butane (dppb), 1,1'-bis(diphenylphosphino)ferrocene (dppf), 2,2'-bis(diphenylphosphino)-1,1'-binaphthyl (BINAP), and 1,2-bis(dicylohexylphosphino)ethane.

12. Process according to claim 1, characterized in that the Ni(0) catalyst is $Ni(COD)_2$ or $Ni(CO)_4$.

13. Process according to claim 1, characterized in that it is carried out in a solvent selected from diethyl ether, THF, 2-methyltetrahydrofuran, tetrahydropyran, dioxane or diphenyl ether.

14. Process according to claim 1, characterized in that the polymer has a regioregularity of 95% or higher, and a degree of polymerisation $n \geq 50$.

* * * * *

UNITED STATES PATENT AND TRADEMARK OFFICE
CERTIFICATE OF CORRECTION

PATENT NO. : 8,221,652 B2
APPLICATION NO. : 12/524611
DATED : July 17, 2012
INVENTOR(S) : Timo Hoffart et al.

It is certified that error appears in the above-identified patent and that said Letters Patent is hereby corrected as shown below:

Column 25, line 25, delete:

"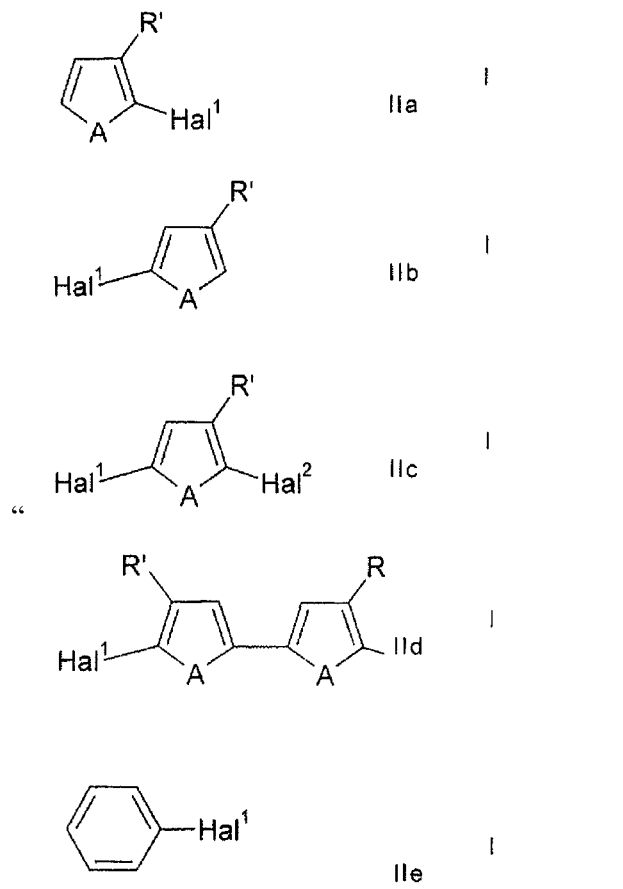"

Signed and Sealed this
Twenty-seventh Day of November, 2012

David J. Kappos
*Director of the United States Patent and Trademark Office*

CERTIFICATE OF CORRECTION (continued)
U.S. Pat. No. 8,221,652 B2

Column 25, line 25, insert:

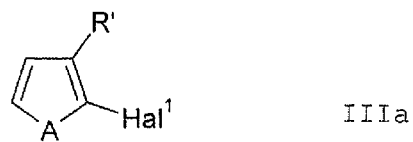 IIIa

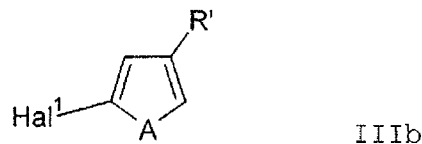 IIIb

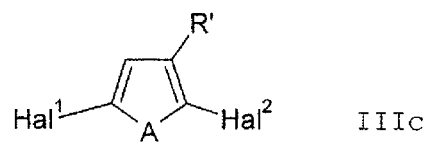 IIIc

--

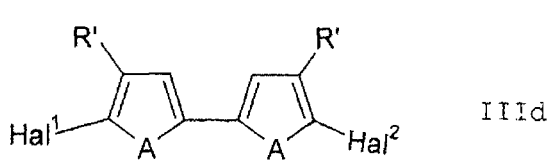 IIId

 IIIe

--